(12) United States Patent
Mutter et al.

(10) Patent No.: US 11,977,507 B2
(45) Date of Patent: May 7, 2024

(54) USER STATION FOR A SERIAL BUS SYSTEM, AND METHOD FOR COMMUNICATING IN A SERIAL BUS SYSTEM

(71) Applicant: Robert Bosch GmbH, Stuttgart (DE)

(72) Inventors: Arthur Mutter, Neuhausen (DE); Florian Hartwich, Reutlingen (DE); Franz Bailer, Moessingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/775,505

(22) PCT Filed: Dec. 1, 2020

(86) PCT No.: PCT/EP2020/084129
§ 371 (c)(1),
(2) Date: May 9, 2022

(87) PCT Pub. No.: WO2021/110678
PCT Pub. Date: Jun. 10, 2021

(65) Prior Publication Data
US 2022/0398212 A1    Dec. 15, 2022

(30) Foreign Application Priority Data
Dec. 2, 2019    (DE) ............... 10 2019 218 714.5

(51) Int. Cl.
*G06F 13/42*    (2006.01)
*H04L 1/00*    (2006.01)
*H04L 12/40*    (2006.01)

(52) U.S. Cl.
CPC ........ *G06F 13/4282* (2013.01); *H04L 1/0008* (2013.01); *H04L 12/40013* (2013.01); *H04L 2001/0094* (2013.01)

(58) Field of Classification Search
CPC ...... G06F 13/4248; G06F 13/38; G06F 13/42; G06F 13/4286; G06F 13/4295;
(Continued)

(56) References Cited

U.S. PATENT DOCUMENTS 9,258,244 B1    2/2016  Boyd et al.
2014/0365693 A1*  12/2014  Monroe ............... G06F 3/00
                                                710/105
(Continued)

FOREIGN PATENT DOCUMENTS

CA    2297717 A1    8/2000
DE    102011080476 A1    2/2013
(Continued)

OTHER PUBLICATIONS

International Search Report for PCT/EP2020/084129, dated Mar. 3, 2021.
(Continued)

*Primary Examiner* — Raymond N Phan
(74) *Attorney, Agent, or Firm* — NORTON ROSE FULBRIGHT US LLP; Gerard A. Messina

(57) ABSTRACT

A user station for a serial bus system. The user station includes a communication control device for controlling a communication of the user station with at least one other user station, and a transceiver device to serially transmit a transmission signal, generated by the communication control device, onto a bus, and serially receive signals from the bus. The communication control device generates the transmission signal according to a frame and inserts into the frame two check sums that include different bits of the frame in the computation. The communication control device inserts dynamic stuff bits into the frame in such a way that an inverse stuff bit is inserted into the bit stream of the frame after 5 identical bits in succession. The communication
(Continued)

control device computes the two check sums so that a maximum of one of the two check sums includes the dynamic stuff bits in the computation.

8 Claims, 8 Drawing Sheets

(58) Field of Classification Search
CPC ........... H04L 12/4013; H04L 12/40013; H04L 12/40032; H04L 12/40163; H04L 12/40169; H04L 12/40143; H04L 12/40215

See application file for complete search history.

(56) References Cited

U.S. PATENT DOCUMENTS

| | | |
|---|---|---|
| 2017/0262400 A1 | 9/2017 | Hartwich et al. |
| 2017/0289321 A1 | 10/2017 | Hartwich et al. |
| 2019/0385057 A1* | 12/2019 | Litichever ............... H04L 63/14 |
| 2021/0306177 A1* | 9/2021 | Fredriksson ........ H04L 41/0627 |
| 2022/0046114 A1* | 2/2022 | Entelis ................... H04L 12/40 |
| 2022/0407619 A1* | 12/2022 | Senger ..................... H04L 9/34 |

FOREIGN PATENT DOCUMENTS

| | | |
|---|---|---|
| DE | 102011122801 A1 | 4/2015 |
| JP | 2017532852 A | 11/2017 |
| WO | 2020126760 A1 | 6/2020 |
| WO | 2020157086 A1 | 8/2020 |

OTHER PUBLICATIONS

Vector Germany, CAN—Still Room for Improvement, How CAN XL can establish the proven CAN technology in the automotive 10-megabit domain, (2019), pp. 7, 9, 11-17, 19-22, URL:https://cdn.vector.com/cms/content/events/2019/VTT19/present ations/VTT19_24102019_CAN_XL_Room_for_Improvement.pdf.

* cited by examiner

USER STATION FOR A SERIAL BUS SYSTEM, AND METHOD FOR COMMUNICATING IN A SERIAL BUS SYSTEM

FIELD

The present invention relates to a user station for a serial bus system, and a method for communicating in a serial bus system that operates with a high data rate as well as great flexibility and with a high level of error robustness.

BACKGROUND INFORMATION

Bus systems for the communication between sensors and control units, for example in vehicles, are intended to allow the transfer of a large data volume, depending on the number of functions of a technical facility or a vehicle. Often there is a requirement for the data to be transferred from the sender to the receiver more quickly than previously, and also for large data packets to be transferable as needed.

At the present time, in vehicles, a bus system is used in the introduction phase, in which data are transferred as messages under the ISO 11898-1:2015 standard, as a CAN protocol specification with CAN FD. The messages are transferred between the bus users of the bus system, such as the sensor, control unit, transducer, etc. With most manufacturers, CAN FD is used in the vehicle at a 2 Mbit/s data bit rate and a 500 kbit/s arbitration bit rate in the first step.

To allow even higher data rates, at the present time a successor bus system for CAN FD (referred to below as CAN XL) is being developed. In addition to the strict data transport, CAN XL is intended to also support other functions via the CAN bus, such as functional safety, data security, and quality of service (QoS). These are basic properties that are required in an autonomously traveling vehicle.

It is very advantageous when CAN XL and CAN FD as well as conventional CAN are compatible. In such a case, a distinction is made between CAN FD and CAN XL frames with the aid of the res bit in the CAN FD frame. Due to the compatibility, up to this res bit, the rules for dynamic stuff bits that are used for the CAN FD arbitration field are also to be applied for CAN XL.

For the functional safety of a system, it is very advantageous and important for the residual error probability to be as small as possible. Class 1 errors, namely, bits (bit flips) sampled erroneously in an inverted manner, and/or class 2 errors, namely, locally accumulated bit errors (burst errors), may be detected with sufficient probability with the aid of a check sum (cyclic redundancy check (CRC)). It is to be noted that a receiving user station also carries out a format check of the frame. This assists in particular with also detecting burst errors. The quality of the error detection may be expressed by the residual error probability. The residual error probability indicates how likely it is that a frame is accepted as correct, despite errors in a receiving user station (reception node) of the bus system that is not a sender of the frame.

For conventional CAN, the CRC computation has the following disadvantage. For conventional CAN, the dynamic stuff bits are not included in the CRC computation. For this reason, for conventional CAN there is a class 3 of errors which the check sum (CRC) cannot reliably detect. This error (class 3) is caused by "flipping" of only two bits, which is also referred to as bit flip. One bit flip generates a dynamic stuff condition, and the other bit flip cancels a dynamic stuff condition. The order of the bit flips in the serially transferred bits (bit stream) does not matter. Thus, the CRC computation does not detect such an error with a high probability, even if the CRC computation actually can reliably detect five bit flips (class 1 error) for conventional CAN. A class 3 error is thus a particularly problematic case or a critical error.

However, for CAN FD the CRC computation has the following disadvantage. In order for CAN FD to be robust against the class 3 error, the dynamic stuff bits are included in the CRC computation for CAN FD. However, it has subsequently been found that there is a class 4 error here that is not detected by the CAN FD CRC. This class 4 error is an individual bit drop or a bit insertion in the data stream of the receiving user station for a dynamic stuff condition. This means that due to an incorrect resynchronization, the receiving user station "sees" one bit more or one bit less than is actually transferred from the sending user station (transmission node). However, this is not apparent, since for CAN, the dynamic stuff bits are inserted with the same value only after 5 identical bits.

The inclusion of the dynamic stuff bits in the CRC computation for CAN FD makes a "stuff bit count" in the CRC field necessary. This stuff bit count reduces the probability that a class 4 error remains undiscovered, but does not completely solve the problem. However, such a stuff bit count results in complexity, and data overhead which lowers the transferable useful data rate.

In addition, for CAN FD there is no header check sum (header CRC). As a result, an error in the code of the data length field (data length code (DLC)) cannot be detected.

Thus, a bit error in the code of the data length field may result in a receiving user station (reception node) of the bus system, which is not a sender of the CAN FD frame, decoding an incorrect frame length in the CAN FD frame. Therefore, the receiving user station (reception node) checks the check sum (CRC) at the wrong location.

If the CRC computation for CAN XL were carried out in the same way as for CAN FD, CAN XL would have the same disadvantages as CAN FD.

SUMMARY

An object of the present invention is to provide a user station for a serial bus system, and a method for communicating in a serial bus system, which solve the above-mentioned problems. In particular, an object is to provide a user station for a serial bus system, and a method for communicating in a serial bus system, in which errors in conjunction with dynamic stuff bits in a bit stream are detected with high reliability in order to achieve a high level of error robustness of the communication, even for a high data rate and an increase in the quantity of the useful data per frame.

The object may be achieved by a user station for a serial bus system in accordance with the present invention. In accordance with an example embodiment of the present invention, the user station includes a communication control device for controlling a communication of the user station with at least one other user station of the bus system, and
  a transceiver device that is designed to serially transmit a transmission signal, generated by the communication control device, onto a bus of the bus system, and that is designed to serially receive signals from the bus of the bus system, the communication control device being designed to generate the transmission signal according to a frame, and to insert into the frame two check sums that include different bits of the frame in the computation, the communication control device being designed to insert dynamic stuff bits into the frame in such a way that an inverse stuff bit is inserted into the bit stream of the frame after 5 identical bits in succession, and the communication control device being designed to compute the two check sums in such a way that a maximum of one of the two check sums includes the dynamic stuff bits in the computation.

Due to its design, the user station in accordance with the present invention may detect class 3 and class 4 errors with sufficient reliability. The reason is that one of the two check sums (CRCs) in the CAN XL frame may detect the class 3 errors with sufficient reliability, and the other check sum (CRC) may detect the class 4 errors with sufficient reliability. As a result, a stuff bit count field in the frame may be saved, which increases the useful data rate. Consequently, for the user station described above, for example a stuff bit count field is not absolutely necessary, as is the case for CAN FD. To reduce the residual error probability even further, for the CAN XL frame a stuff bit count field, referred to here as an SBC field, may nevertheless be additionally inserted.

Furthermore, due to its design, the user station in accordance with the present invention may avoid the above-mentioned disadvantages of CAN FD in conjunction with stuff bits in a very satisfactory manner. This means that the user station may detect an error with sufficient reliability during the sampling of the data length code. As a result, the receiver of the frame knows the correct frame length, and may therefore also check the check sum (cyclic redundancy check (CRC)) at the end of the frame at the right location.

As a result, by use of the user station, transmission and reception of the frames may be ensured with great functional safety and great flexibility with regard to instantaneous events during operation of the bus system and at a low error rate, even with an increased volume of useful data per frame.

By use of the user station in the bus system, it is thus possible in particular to maintain an arbitration from CAN in a first communication phase and still increase the transfer rate considerably compared to CAN or CAN FD.

The method carried out by the user station may also be used when at least one CAN user station and/or at least one CAN FD user station that transmit(s) messages according to the CAN protocol and/or CAN FD protocol are/is present in the bus system.

Advantageous further embodiments of the user station of the present invention are disclosed herein.

According to one option, the communication control device is designed to insert a first field into the frame in which the number of dynamic stuff bits are encoded, the communication control device being designed to insert the at least one first field prior to a data field in which useful data of the frame are inserted.

In accordance with an example embodiment of the present invention, the transceiver device for serially transmitting a transmission signal, generated by the communication control device, onto a bus of the bus system is possibly designed in such a way that for a message that is exchanged between user stations of the bus system, the bit time of a signal transmitted onto the bus in a first communication phase may be different from a bit time of a signal transmitted in a second communication phase.

According to one particular embodiment of the present invention, the communication control device is designed to insert a second field into the frame, which is designed to check whether the bit stream of the frame in a user station of the bus system, which has received the frame but has not sent it, is shifted by at least one bit compared to the expected frame, the communication control device being designed to insert the at least one second field into the frame after a data field, in particular to insert the at least one field into the frame after a frame check sum that has been formed over all bits in the frame.

According to one exemplary embodiment of the present invention, the communication control device is designed to insert, after the at least one second field, a synchronization field including two bits into the frame in such a way that the two bits have different values, so that the bits form a synchronization edge that is situated according to a bit pattern for switching over the bit rate to transmit the transmission signal onto the bus, and for switching over a physical layer of the transceiver device.

It is possible for the frame that is formed for the message to have a design that is compatible with CAN FD, in a first communication phase it being negotiated which of the user stations of the bus system in a subsequent second communication phase obtains, at least temporarily, exclusive, collision-free access to the bus.

The user station described above may be part of a bus system which also includes a bus and at least two user stations that are connected to one another via the bus in such a way that they may communicate serially with one another. At least one of the at least two user stations is a user station described above.

Moreover, the object stated above may be achieved by a method for communicating in a serial bus system according to the present invention. The method is carried out with a user station of the bus system that includes a communication control device and a transceiver device. In accordance with an example embodiment of the present invention, the method includes the steps: controlling, via the communication control device, a communication of the user station with at least one other user station of the bus system, and transmitting, via the transceiver device, a transmission signal, generated by the communication control device, onto a bus of the bus system, the transceiver device also being designed to serially receive signals from the bus of the bus system, generating, via the communication control device, the transmission signal according to a frame, the communication control device inserting two check sums into the frame that include different bits of the frame in the computation, the communication control device inserting dynamic stuff bits into the frame in such a way that an inverse stuff bit is inserted into the bit stream of the frame after 5 identical bits in succession, and the communication control device computing the two check sums in such a way that a maximum of one of the two check sums includes the dynamic stuff bits in the computation.

The method yields the same advantages as stated above with regard to the user station.

Further possible implementations of the present invention also include combinations, even if not explicitly stated, of features or specific embodiments described above or discussed below with regard to the exemplary embodiments. Those skilled in the art will also add individual aspects as enhancements or supplements to the particular basic form of the present invention, in view of the disclosure herein.

BRIEF DESCRIPTION OF THE DRAWINGS

The present invention is described in greater detail below with reference to the figures, and based on exemplary embodiments.

Unless stated otherwise, identical or functionally equivalent elements are provided with the same reference numerals in the figures.

DETAILED DESCRIPTION OF EXAMPLE EMBODIMENTS

Figure 1:
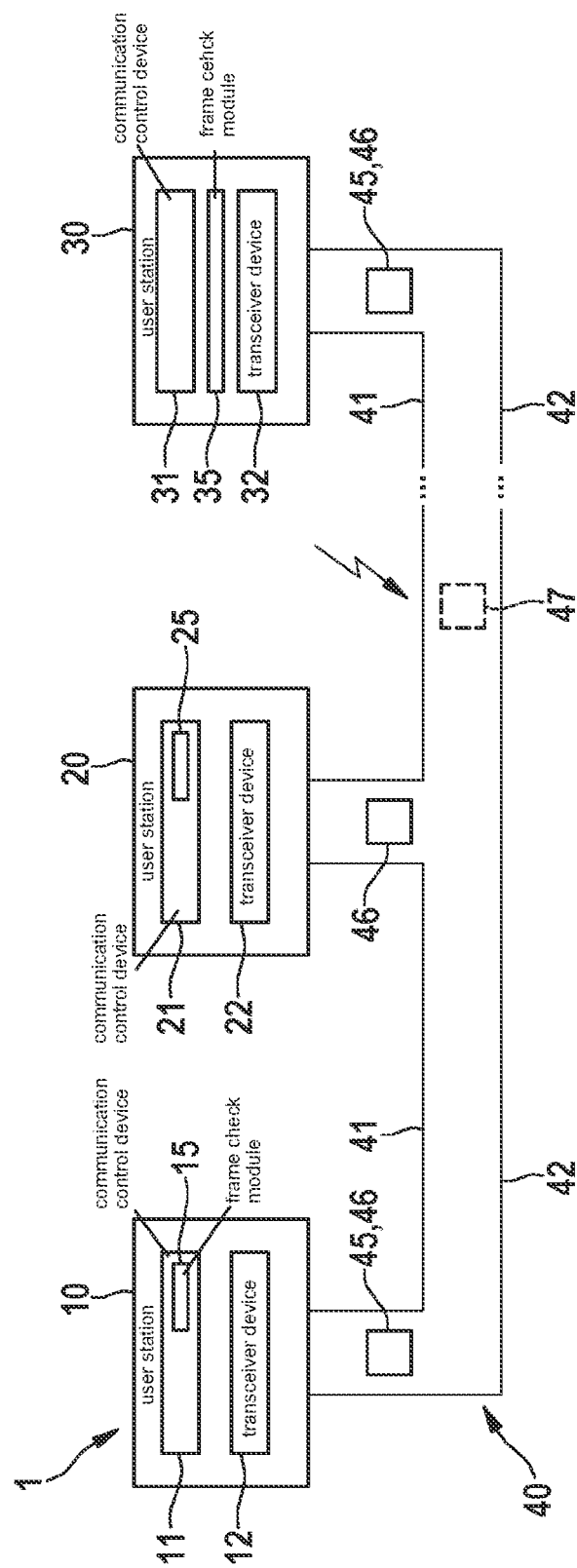
FIG. 1 shows a simplified block diagram of a bus system according to a first exemplary embodiment of the present invention.

FIG. 1 shows as an example a bus system 1 that is in particular the basis for the design of a CAN bus system, a CAN FD bus system, a CAN XL bus system, and/or modifications thereof, as described below. Bus system 1 may be used in a vehicle, in particular a motor vehicle, an aircraft, etc., or in a hospital, and so forth.

In FIG. 1, bus system 1 includes a plurality of user stations 10, 20, 30, each of which is connected to a first bus wire 41 and a second bus wire 42 at a bus 40. Bus wires 41, 42 may also be referred to as CAN_H and CAN_L or CAN XL_H and CAN XL_L, and are used for electrical signal transfer after coupling-in the dominant levels or generating recessive levels or other levels for a signal in the transmission state. Messages 45, 46 in the form of signals are serially transferable between individual user stations 10, 20, 30 via bus 40. If an error occurs during the communication on bus 40, as illustrated by the serrated dark block arrow in FIG. 1, an error frame 47 (error flag) may optionally be transmitted. User stations 10, 20, 30 are, for example, control units, sensors, display devices, etc., of a motor vehicle.

As shown in FIG. 1, user station 10 includes a communication control device 11, a transceiver device 12, and a frame check module 15. User station 20 includes a communication control device 21 and a transceiver device 22. User station 30 includes a communication control device 31, a transceiver device 32, and a frame check module 35. Transceiver devices 12, 22, 32 of user stations 10, 20, 30 are each directly connected to bus 40, although this is not illustrated in FIG. 1.

Communication control devices 11, 21, 31 are each used for controlling a communication of particular user station 10, 20, 30 via bus 40 with at least one other user station of user stations 10, 20, 30 connected to bus 40.

Communication control devices 11, 31 create and read first messages 45, which are modified CAN messages 45, for example. Modified CAN messages 45 are built up based on a CAN XL format, described in greater detail with reference to FIG. 2, and in which particular frame check module 15, 35 is used. Communication control devices 11, 31 may also be designed to provide a CAN XL message 45 or a CAN FD message 46 for transceiver device 32 or receive it from same, as needed. Particular format check modules 15, 35 are also used. Communication control devices 11, 31 thus create and read a first message 45 or second message 46, first and second messages 45, 46 differing by their data transmission standard, namely, CAN XL or CAN FD in this case.

Communication control device 21 may be designed as a conventional CAN controller according to ISO 11898-1: 2015, i.e., as a CAN FD-tolerant conventional CAN controller or a CAN FD controller. Communication control device 21 creates and reads second messages 46, for example CAN FD messages 46. CAN FD messages 46 may include 0 to 64 data bytes, which are also transferred at a much faster data rate than with a conventional CAN message. In particular, communication control device 21 is designed as a conventional CAN FD controller.

Transceiver device 22 may be designed as a conventional CAN transceiver according to ISO 11898-1:2015 or as a CAN FD transceiver. Transceiver devices 12, 32 may be designed to provide messages 45 according to the CAN XL format or messages 46 according to the present CAN FD format for associated communication control device 11, 31 or receive the messages from same, as needed.

A formation and then transfer of messages 45 having the CAN XL format, in addition to the reception of such messages 45, is achievable by use of the two user stations 10, 30.

Figure 2:
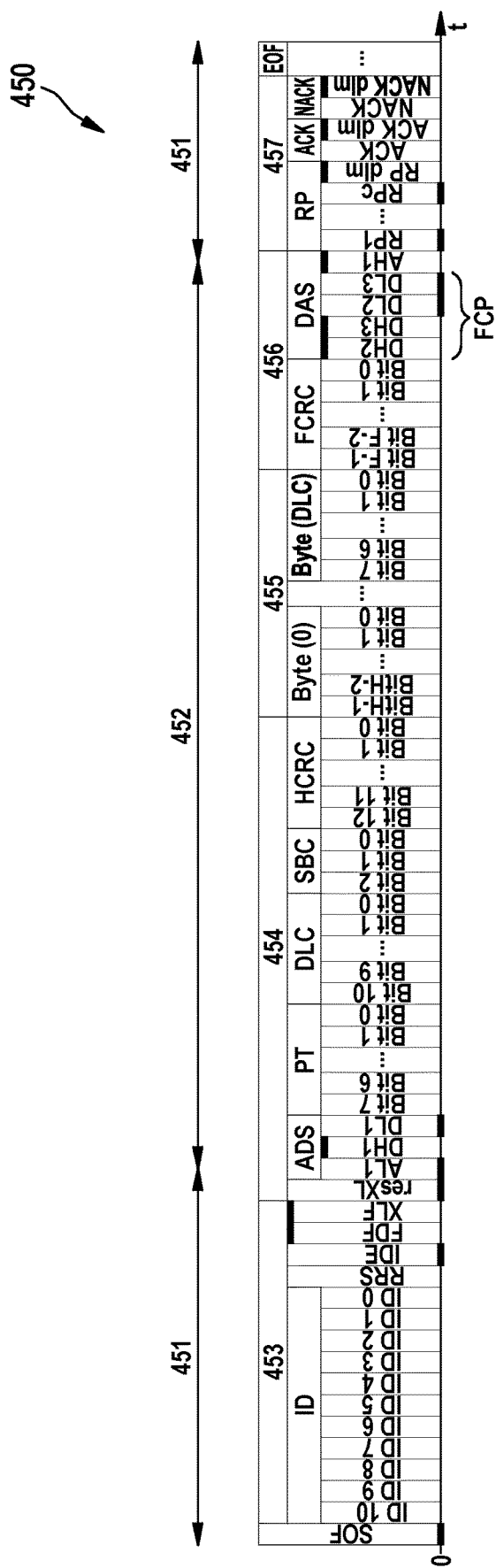
FIG. 2 shows a diagram for illustrating the design of a message that may be transmitted from a user station of the bus system according to the first exemplary embodiment of the present invention.

FIG. 2 shows for message 45 a CAN XL frame 450, which is provided by communication control device 11 for transceiver device 12 for transmitting onto bus 40. In the present exemplary embodiment, communication control device 11 creates frame 450 so as to be compatible with CAN FD, as also illustrated in FIG. 2. The same analogously applies for communication control device 31 and transceiver device 32 of user station 30.

According to FIG. 2, for the CAN communication on bus 40, CAN XL frame 450 is divided into different communication phases 451, 452, namely, an arbitration phase 451 and a data phase 452. Frame 450 includes an arbitration field 453, a control field 454, a data field 455, a check sum field 456 for a check sum FCRC, a switchover sequence ADS, and an acknowledgment field 457.

In arbitration phase 451, with the aid of an identifier ID in arbitration field 453, bit-by-bit negotiation is carried out between user stations 10, 20, 30 concerning which user station 10, 20, 30 would like to transmit message 45, 46 having the highest priority, and therefore for the next time period for transmitting in subsequent data phase 452 obtains exclusive access to bus 40 of bus system 1. A physical layer, similarly as with CAN and CAN FD, is used in arbitration phase 451. The physical layer corresponds to the bit transfer layer or layer one of the conventional Open Systems Interconnection (OSI) model.

An important point during phase 451 is that the conventional CSMA/CR method is used, which allows simultaneous access of user stations 10, 20, 30 to bus 40 without destroying higher-priority message 45, 46. It is thus possible to add further bus user stations 10, 20, 30 to bus system 1 in a relatively simple manner, which is very advantageous.

Consequently, the CSMA/CR method must provide so-called recessive states on bus 40, which may be overwritten by other user stations 10, 20, 30 with dominant states on bus 40. In the recessive state, high-impedance conditions prevail at individual user station 10, 20, 30, which in combination with the parasites of the bus wiring result in longer time constants. This results in a limitation of the maximum bit rate of the present-day CAN FD physical layer to approximately 2 megabits per second at the present time during actual vehicle use.

In data phase 452, in addition to a portion of control field 454, the useful data of the CAN XL frame or of message 45 from data field 455 and check sum field 456 for check sum FCRC, and also a field DAS, which is used to switch over from data phase 452 back to arbitration phase 451, are transmitted.

A sender of message 45 starts a transmission of bits of data phase 452 onto bus 40 only after user station 10, as the sender, has won the arbitration, and user station 10, as the sender, thus has exclusive access to bus 40 of bus system 1 for the transmission.

In general, in the bus system with CAN XL, in comparison to CAN or CAN FD the following differing properties may be achieved:
a) acquiring and optionally adapting proven properties that are responsible for the robustness and user-friendliness of CAN and CAN FD, in particular a frame structure including identifiers and arbitration according to the CSMA/CR method,
b) increasing the net data transfer rate, in particular to approximately 10 megabits per second,
c) increasing the quantity of the useful data per frame, in particular to approximately 4 kbytes or some other arbitrary value.

As illustrated in FIG. 2, in arbitration phase 451 user station 10 partially uses as the first communication phase, in particular up to and including the FDF bit, a format from CAN/CAN FD according to ISO 11898-1:2015. In contrast, beginning with the FDF bit in the first communication phase and in the second communication phase (data phase 452), user station 10 uses a CAN XL format, as described below.

In the present exemplary embodiment, CAN XL and CAN FD are compatible. The res bit from CAN FD, referred to below as the XLF bit, is utilized for switching from the CAN FD format over to the CAN XL format. Therefore, the frame formats of CAN FD and CAN XL are identical up to the res bit. Not until the res bit does a receiver detect in which format the frame is transmitted. A CAN XL user station, i.e., user stations 10, 30 here, also support(s) CAN FD.

As an alternative to frame 450 shown in FIG. 2, in which an identifier including 11 bits is used, a CAN XL expanded frame format is optionally possible in which an identifier including 29 bits is used. Up until the FDF bit, this is identical to the CAN FD expanded frame format from ISO 11898-1:2015.

According to FIG. 2, frame 450 from the SOF bit up to and including the FDF bit is identical to the CAN FD base frame format according to ISO 11898-1:2015. Therefore, the conventional structure is not further explained here. Bits illustrated with a thick bar at their lower line in FIG. 2 are transmitted in frame 450 as dominant or "0." Bits illustrated with a thick bar at their upper line in FIG. 2 are transmitted in frame 450 as recessive or "1." In CAN XL data phase 452, symmetrical "1" and "0" levels are used instead of recessive and dominant levels.

In general, two different stuffing rules are applied in the generation of frame 450. Up until the XLF bit in control field 454, the dynamic bit stuffing rule from CAN FD applies, so that an inverse stuff bit is to be inserted after 5 identical bits in succession. Such stuff bits are also referred to as dynamic stuff bits. A fixed stuffing rule applies after a resXL bit in control field 454, so that a fixed stuff bit is to be inserted after a fixed number of bits. Alternatively, instead of only one stuff bit, 2 or more bits may be inserted as fixed stuff bits, as also described in greater detail below.

In frame 450, the FDF bit is directly followed by the XLF bit, which from the position corresponds to the "res bit" in the CAN FD base frame format, as mentioned above. If the XLF bit is transmitted as 1, i.e., recessive, it thus identifies frame 450 as a CAN XL frame. For a CAN FD frame, communication control device 11 sets the XLF bit as 0, i.e., dominant.

In frame 450, the XLF bit is followed by a resXL bit, which is a dominant bit for future use. For frame 450, the resXL bit must be transmitted as 0, i.e., dominant. However, if user station 10 receives a resXL bit as 1, i.e., recessive, receiving user station 10 goes into a protocol exception state, for example, as carried out with a CAN FD message 46 for res=1. Alternatively, the resXL bit could be defined the opposite way, i.e., that it must be transmitted as 1, i.e., recessive. In this case, for a dominant resXL bit the receiving user station goes into the protocol exception state.

In frame 450, the resXL bit is followed by a sequence ADS (arbitration data switch), in which a predetermined bit sequence is encoded. This bit sequence allows a simple and reliable switch from the bit rate of arbitration phase 451 (arbitration bit rate) over to the bit rate of data phase 452 (data bit rate). For example, the bit sequence of the ADS sequence is made up, among other things, of an AL1 bit that is transmitted as dominant, i.e., 0. The AL1 bit is the last bit of arbitration phase 451. In other words, the AL1 bit is the last bit prior to the switchover into data phase 452 with the short bits. The physical layer in transceiver device 12, 22, 32 is switched over within the AL1 bit. The AL1 bit could also have the value 1, depending on which value (0 or 1) is better suited for the switchover of the physical layer in transceiver device 12, 32 (transceiver). The two subsequent bits DH1 and DL1 are already transmitted at the data bit rate. For CAN XL, bits DH1 and DL1 are thus temporally short bits of data phase 452.

In frame 450, sequence ADS is followed by a PT field that denotes the contents of data field 455. The contents indicate what type of information is contained in data field 455. For example, the PT field indicates whether an Internet Protocol (IP) frame, a tunneled Ethernet frame, or some other frame is present in data field 455.

The PT field is followed by a DLC field into which data length code DLC, which indicates the number of bytes in data field 455 of frame 450, is inserted. Data length code DLC may assume any value from 0 up to the maximum length of data field 455 or the data field length. If the maximum data field length is in particular 2048 bits, data length code DLC requires 11 bits, under the assumptions that DLC=0 means a data field length that includes 1 byte, and DLC=2047 means a data field length that includes 2048 bytes. Alternatively, a data field 455 having the length 0 could be allowed, as with CAN, for example. DLC=0 would encode, for example, the data field length with 0 byte. With 11 bits, for example, the maximum encodable data field length is then $(2^{11})-1=2047$.

In the example from FIG. 2, in frame 450 the DLC field is followed by an SBC field. The abbreviation SBC stands for "stuff bit count." The SBC field encodes the number of dynamic stuff bits in the header of frame 450. In principle, the SBC field may be placed at any location in the header of frame 450, between the ADS field and the end of the header of frame 450. A placement of the SBC field prior to a header check sum HCRC is advantageous so that the SBC field may be safeguarded by header check sum HCRC.

In frame 450 from FIG. 2, the SBC field is followed by a header check sum HCRC. Header check sum HCRC is a check sum for safeguarding the header of frame 450, i.e., all relevant bits from the start of frame 450 including the SOF bit to the start of header check sum HCRC, including all dynamic, and optionally, fixed, stuff bits up to the start of header check sum HCRC. The relevant bits include only the bits of the frame header that have a changeable value. In other words, the relevant bits include no bits that always have a fixed value in frame 450. Thus, such bits having an unchangeable value are not safeguarded, since these bits have a fixed value. The length of header check sum HCRC, and thus of the check sum polynomial according to cyclic redundancy check CRC, is to be selected corresponding to the desired Hamming distance. For a data length code DLC of 11 bits, the data word to be safeguarded by header check sum HCRC is longer than 27 bits. Therefore, in order to achieve a Hamming distance of 6, the polynomial of header check sum HCRC must be at least 13 bits long.

In frame 450, header check sum HCRC is followed by data field 455. Data field 455 is made up of 1 to n data bytes, where n is, for example, 2048 bytes or 4096 bytes or some other arbitrary value. Alternatively, a data field length of 0 is possible. The length of data field 455 is encoded in the DLC field, as described above.

In frame 450, data field 455 is followed by a frame check sum FCRC. Frame check sum FCRC is made up of the bits of frame check sum FCRC. The length of frame check sum FCRC, and thus of the CRC polynomial, is to be selected corresponding to the desired Hamming distance. Frame check sum FCRC safeguards entire frame 450. Alternatively, only data field 455 is optionally safeguarded with frame check sum FCRC.

In frame 450, frame check sum FCRC is followed by sequence DAS (data arbitration switch) in which a predetermined bit sequence is encoded. This bit sequence allows a simple and reliable switch from the data bit rate of data phase 452 over to the arbitration bit rate of arbitration phase 451. For example, the bit sequence begins with data bits DH2, DH3, which are transmitted as 1, and data bits DL2, DL3, which are transmitted as 0, as shown in FIG. 2. These are the last 4 bits of data phase 452. Thus, the DL3 bit is the last short bit, i.e., the last bit prior to the switchover into arbitration phase 451 with the long bits. The bits are followed by an AH1 bit having the value 1 of arbitration phase 451. The physical layer in transceiver device 12, 32 (transceiver) is switched over within the AH1 bit. The AH1 bit could alternatively have the value 0, depending on which value (0 or 1) is better suited for the switchover of the physical layer in transceiver device 12, 32 (transceiver). An RX user station 10, 30, which is only a receiver of frame 450, i.e., has not transmitted received frame 450, uses bit sequence DH2, DH3, DL2, DL3 not only for the synchronization, but also as a format check pattern. With this bit sequence, RX user station 10, 30 may recognize whether it is sampling the bit stream received from bus 40 in a shifted manner, for example shifted by 1 bit or 2 bits, etc. According to yet another example, the DAS field generally includes three bits, i.e., the DH2 bit, the DL2 bit, and an AH1 bit. Of the bits, the first bit and last bit are transmitted as 1, and the middle bit is transmitted as 0.

In the above examples, the last synchronization prior to the switchover from data phase 452 into arbitration phase 451 may be carried out at the edge between the DH3 bit and the DL2 bit or between the DH2 bit and the DL2 bit in the receiving user station.

Thus, in the present exemplary embodiment, sequence DAS contains a format check pattern FCP via which user stations 10, 30, in particular their format check modules 15, 35, are able to detect in a received frame 450 a shift of the bit stream, even if associated user stations 10, 30 are not senders, but instead are only receivers of frame 450. The longer the bit pattern of the FCP field, the greater or stronger is the shift that may be detected in receiving user station 10, 30. The most advantageous bit pattern for the shift detection contains an even number of M bits, the first M/2 bits containing a 1 and the subsequent M/2 bits containing a 0. In the example from FIG. 2, with an FCP field including 4 bits, the first two bits are transmitted as recessive, i.e., 1. The last two bits of the FCP field are transmitted as dominant, i.e., 0. Thus, the FCP field including four bits according to FIG. 2, due to additional bits DH3, DL3, differs from the customary two bits at the start of the FCP field. However, the edge from recessive to dominant in the FCP field from FIG. 2 may fulfill the same function as in a DAS field, which does not include bits DH3, DL3.

In general, it is possible that in the FCP field, the first M/2 bits contain a 0 and the subsequent M/2 bits contain a 1. A shift by M−1 may be detected using field FCP. This is described in greater detail below with reference to FIG. 3.

In frame 450, sequence DAS is followed by an acknowledgment field 457, which starts with an RP field. A synchronization pattern (sync pattern) is kept in the RP field, and allows a receiving user station 10, 30 to detect the start of arbitration phase 451 after data phase 452. The synchronization pattern allows receiving user stations 10, 30, which cannot detect the correct length of data field 455, for example due to an erroneous header check sum HCRC, to synchronize. These user stations may subsequently transmit a "negative acknowledge" in order to communicate the incorrect reception. This is very important in particular when CAN XL no longer allows error frames 47 (error flags) in data field 455.

The RP field is followed by an acknowledgment (ACK) field 457 made up of multiple bits for acknowledgment or non-acknowledgment of a correct receipt of frame 450. In the example from FIG. 2, an ACK bit, an ACK dlm bit, a NACK bit, and a NACK dlm bit are provided. The NACK bit and the NACK dlm bit are optional bits. Receiving user stations 10, 30 transmit the ACK bit as dominant when they have correctly received frame 450. The transmitting user station transmits the ACK bit as recessive. Therefore, the bit in frame 450 originally transmitted onto bus 40 may be overwritten by receiving user stations 10, 30. The ACK dlm bit is transmitted as a recessive bit, which is used for separation from other fields. The NACK bit and the NACK dlm bit are used so that a receiving user station may signal an incorrect reception of frame 450 on bus 40. The function of the bits is the same as that of the ACK bit and the ACK dlm bit.

In frame 450, acknowledgment (ACK) field 457 is followed by an end field (end of frame (EOF)). The bit sequence of end field EOF is used to denote the end of frame 450. End field EOF ensures that 8 recessive bits are transmitted at the end of frame 450. This is a bit sequence that cannot occur within frame 450. As a result, the end of frame 450 may be reliably detected by user stations 10, 20, 30.

End field EOF has a length that is different, depending on whether a dominant bit or a recessive bit has been observed in the NACK bit. If the transmitting user station has received the NACK bit as dominant, end field EOF includes 7 recessive bits. Otherwise, end field EOF is only 5 recessive bits long.

In frame 450, end field EOF is followed by an interframe space IFS, not illustrated in FIG. 2. This interframe space IFS is designed according to ISO 11898-1:2015, as with CAN FD.

Figure 3:
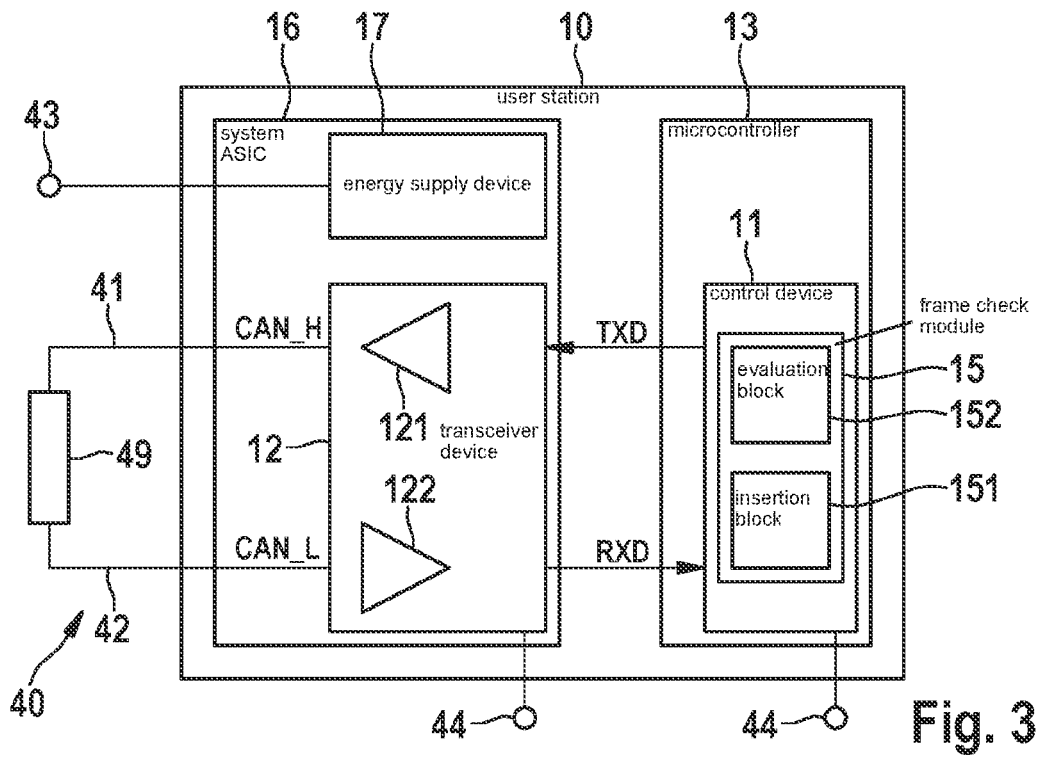
FIG. 3 shows a simplified schematic block diagram of a user station of the bus system according to the first exemplary embodiment of the present invention.

FIG. 3 shows the basic design of user station 10 together with communication control device 11, transceiver device 12, and frame check module 15, which is part of communication control device 11. User station 30 has a design similar to that shown in FIG. 3, except that frame check module 35 according to FIG. 1 is situated separately from communication control device 31 and transceiver device 32. Therefore, user station 30 is not separately described.

According to FIG. 3, in addition to communication control device 11 and transceiver device 12, user station 10 includes a microcontroller 13 with which control device 11 is associated, and a system application-specific integrated circuit (ASIC) 16, which alternatively may be a system base chip (SBC) on which multiple functions necessary for an electronics assembly of user station 10 are combined. In addition to transceiver device 12, an energy supply device 17 that supplies transceiver device 12 with electrical energy is installed in system ASIC 16. Energy supply device 17 generally supplies a voltage CAN Supply of 5 V. However, depending on the requirements, energy supply device 17 may supply some other voltage having a different value. Additionally or alternatively, energy supply device 17 may be designed as a power source.

Frame check module 15 includes an insertion block 151 and an evaluation block 152, which are described in greater detail below.

Transceiver device 12 also includes a transmission module 121 and a reception module 122. Even though transceiver device 12 is consistently referred to below, it is alternatively possible to provide reception module 122 in a separate device externally from transmission module 121. Transmission module 121 and reception module 122 may be designed as a conventional transceiver device 22. Transmission module 121 may in particular include at least one operational amplifier and/or one transistor. Reception module 122 may in particular include at least one operational amplifier and/or one transistor.

Transceiver device 12 is connected to bus 40, or more precisely, to its first bus wire 41 for CAN_H or CAN XL_H and its second bus wire 42 for CAN_L or CAN XL_L. The supplying of voltage for energy supply device 17 for supplying first and second bus wires 41, 42 with electrical energy, in particular with voltage CAN Supply, takes place via at least one terminal 43. The connection to ground or CAN_GND is achieved via a terminal 44. First and second bus wires 41, 42 are terminated via a terminating resistor 49.

In transceiver device 12, first and second bus wires 41, 42 are not just connected to transmission module 121, also referred to as a transmitter, and to reception module 122, also referred to as a receiver, even though the connection in FIG. 3 is not shown for simplification.

During operation of bus system 1, transmission module 121 converts a transmission signal TXD or TxD of communication control device 11 into corresponding signals CAN XL_H and CAN XL_L for bus wires 41, 42, and transmits these signals CAN XL_H and CAN XL_L onto bus 40 at the terminals for CAN_H and CAN_L.

Figure 4:
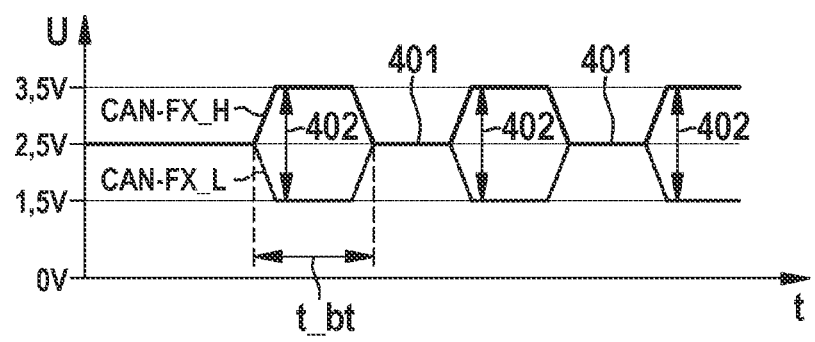
FIG. 4 shows a temporal profile of bus signals CAN XL_H and CAN XL_L for the user station according to the first exemplary embodiment of the present invention.

According to FIG. 4, reception module 122 forms a reception signal RXD or RxD from signals CAN XL_H and CAN XL_L that are received from bus 40, and passes it on to communication control device 11, as shown in FIG. 3. With the exception of an idle or standby state, transceiver device 12 with reception module 122 during normal operation always listens to a transfer of data or messages 45, 46 on bus 40, in particular regardless of whether or not transceiver device 12 is the sender of message 45.

Figure 5:
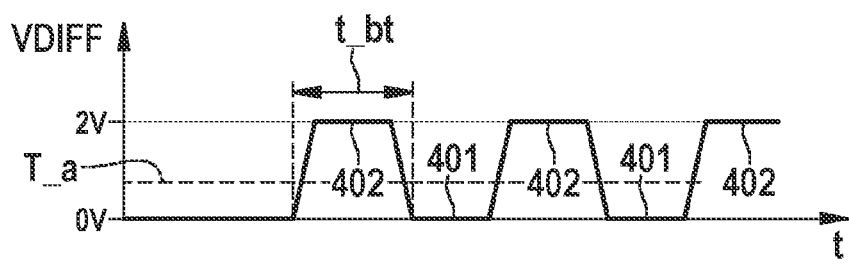
FIG. 5 shows a temporal profile of a differential voltage VDIFF of bus signals CAN XL_H and CAN XL_L for the user station according to the first exemplary embodiment of the present invention.

According to the example from FIG. 4, signals CAN XL_H and CAN XL_L, at least in arbitration phase 451, include dominant and recessive bus levels 401, 402, as from CAN. A difference signal VDIFF=CAN XL_H−CAN XL_L, shown in FIG. 5, is formed on bus 40. The individual bits of signal VDIFF with bit time t_bt may be detected using a reception threshold of 0.7 V. In data phase 452 the bits of signals CAN XL_H and CAN XL_L are transmitted more quickly, i.e., with a shorter bit time t_bt, than in arbitration phase 451. Thus, signals CAN XL_H and CAN XL_L in data phase 452 differ from conventional signals CAN_H and CAN_L, at least in their faster bit rate.

The sequence of states 401, 402 for signals CAN XL_H, CAN XL_L in FIG. 4 and the resulting pattern of voltage VDIFF from FIG. 5 are used only for illustrating the function of user station 10. The sequence of data states for bus states 401, 402 is selectable as needed.

In other words, transmission module 121 in a first operating mode according to FIG. 4 generates a first data state as bus state 402 with different bus levels for two bus wires 41, 42 of the bus line, and a second data state as bus state 401 with the same bus level for the two bus wires 41, 42 of the bus line of bus 40.

In addition, transmission module 121 transmits the bits onto bus 40 at a higher bit rate for the temporal profiles of signals CAN XL_H, CAN XL_L in a second operating mode, which includes data phase 452. CAN XL_H and CAN XL_L signals may also be generated in data phase 452 with a different physical layer than with CAN FD. The bit rate in data phase 452 may thus be increased even further than with CAN FD.

Frame check module 15 from FIG. 3, in particular its insertion block 151, is used to insert the SBC field into frame 450 when user station 10 acts as the sender of frame 450. In the present exemplary embodiment, frame check module 15 from FIG. 3 is designed in such a way that the SBC field includes three bits, i.e., a bit0, a bit1, and a bit2. As a result, the SBC field generates as little data overhead as possible. In the SBC field, frame check module 15 enters the number of dynamic stuff bits into bits bit0 and bit1, and enters the parity of the first two bits into bit2.

In the present exemplary embodiment, insertion block 151 inserts the SBC field prior to header check sum HCRC in frame 450. Frame check module 15, in particular evaluation block 152, also uses the SBC field when forming header check sum HCRC as well as all dynamic stuff bits of the frame header. As a result, class 3 and class 4 errors are detectable.

Frame check module 15 from FIG. 3, in particular its evaluation block 152, is used to form and check the header check sum and the frame check sum, and also to check the number of dynamic stuff bits.

Evaluation block 152 in the receiving user station may compare the number of received dynamic stuff bits in the frame header to the value in the SBC field, and may thus detect a deviation, i.e., error, in comparison to the actual number in the frame header.

In contrast, evaluation block 152 omits the dynamic stuff bits when forming frame check sum FCRC. However, evaluation block 152 includes the other bits of the frame header, such as the ID bit, RRS bit, etc., in the computation of frame check sum FCRC. These bits are thus doubly safeguarded. As a result, by use of frame check module 15, in particular its evaluation block 152, class 3 and class 4 errors that occur in conjunction with dynamic stuff bits are detectable with a very high probability.

Receiving user station (reception node) 10, in particular its frame check module 15 and more precisely its evaluation block 152, may thus detect the critical errors that may occur with dynamic stuff bits in the received bit stream. Evaluation block 152 outputs a corresponding notification to communication control device 11. Received frame 450 may thus be discarded in the event of an error. Consequently, communication control device 11 may optionally send an error frame 47 to bus 40.

However, if a stuff count field such as the SBC field is used, the residual error probability is further reduced. As a result, it is even more unlikely that a faulty frame 450 is accepted as valid.

Thus, the use of the SBC field "stuff count" field, which encodes the number of dynamic stuff bits in the transmitted frame, is optional.

If compatibility with CAN FD is not required, for example so-called fixed stuff bits (stuff bits that are also present) may be used in the frame instead of dynamic stuff bits. Without dynamic stuff bits, the class 3 and class 4 errors cannot occur. In addition, a stuff count field such as the SBC field may be omitted. This results in a smaller number of bits to be transferred, and even results in less complexity.

According to a first modification of the first exemplary embodiment, frame check module 15, in particular evaluation block 152, is designed to omit the dynamic stuff bits when forming header check sum HCRC. In contrast, frame check module 15, in particular evaluation block 152, uses the dynamic stuff bits when forming frame check sum FCRC. Frame check module 15, in particular evaluation block 152, once again includes the other bits of the frame header, such as the ID bit, RRS bit, etc., in the computation of frame check sum FCRC. In this way as well, the particular class 3 and class 4 errors are detectable with sufficient reliability. When error frames 47 are used, the detection may be reported via an error frame 47.

According to a second modification of the first exemplary embodiment, frame check module 15, in particular evaluation block 152, is designed to not include the dynamic stuff bits in any computation of check sums HCRC, FCRC. In this way as well, the class 3 and class 4 errors are detectable with sufficient reliability. The reason is that dynamic stuff bits can occur only from the SOF bit until prior to the FDF bit. A maximum of three dynamic stuff bits may be contained in this small range. As a result, the length of the burst error (packet error), which is a block-by-block disturbance of the bit stream, and which may generate a class 3 error, is limited. Consequently, the probability is high that the header CRC can detect this burst error. When error frames 47 are used, the detection may be reported via an error frame 47.

Figure 6:
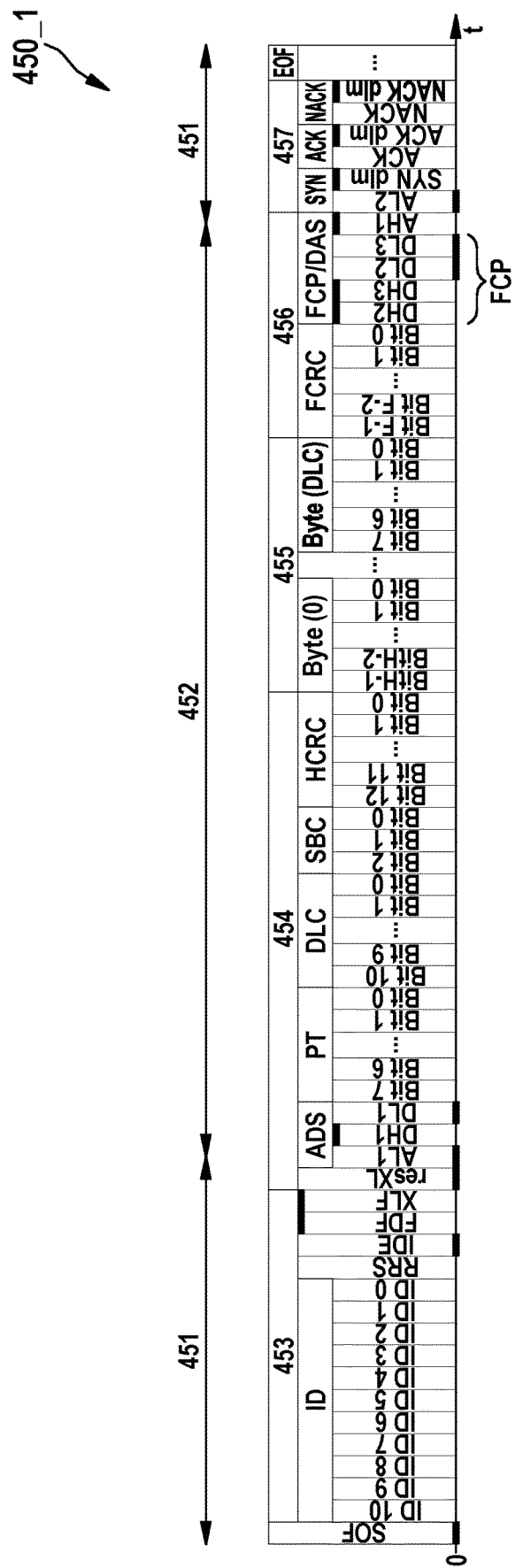
FIG. 6 shows a diagram for illustrating the design of a message that may be transmitted from a user station of the bus system according to a second exemplary embodiment of the present invention.

FIG. 6 shows a frame 450_1 according to a second exemplary embodiment in which CAN XL and CAN FD are compatible. In this exemplary embodiment, error frames (error flags) 47 are used to signal errors.

In the present exemplary embodiment, frame 450_1 and thus the CAN XL frame format are different from frame 450 from FIG. 2, as described below. Only the differences from frame 450 from FIG. 2 are described below. In other respects, frames 450, 450_1 of the two exemplary embodiments are the same.

In frame 450_1, a SYN field having a constant length of 2 bits is present instead of the RP field. The SYN field contains a first bit (AL2) having the digital value 0. Together with preceding bit AH1 having the digital value 1, the bit sequence of bits AL2, AH1 provides a synchronization edge after the switchover of the bit rate and of the physical layer (i.e., of the mode of the CAN XL transceiver).

Thus, two synchronization edges that are necessary for a robust function of CAN XL are present, namely, a synchronization edge directly prior to the bit rate switchover (DH3=>DL2), and a synchronization edge directly after the bit rate switchover (AH1=>AL2). A switch may thus be reliably made prior from data phase 452 into arbitration phase 451.

The second bit in the SYN field, the SYNdlm bit, has the value 1. It is used as a delimitation from the ACK bit. In the error-free case, the ACK bit is sent from the reception node as 0 (dominant), and thus generates a further synchronization edge.

Since error frames (error flags) 47 are used, the use of a NACK field is strictly optional due to the fact that errors may already be signaled via error frames (error flags) 47.

Figure 7:
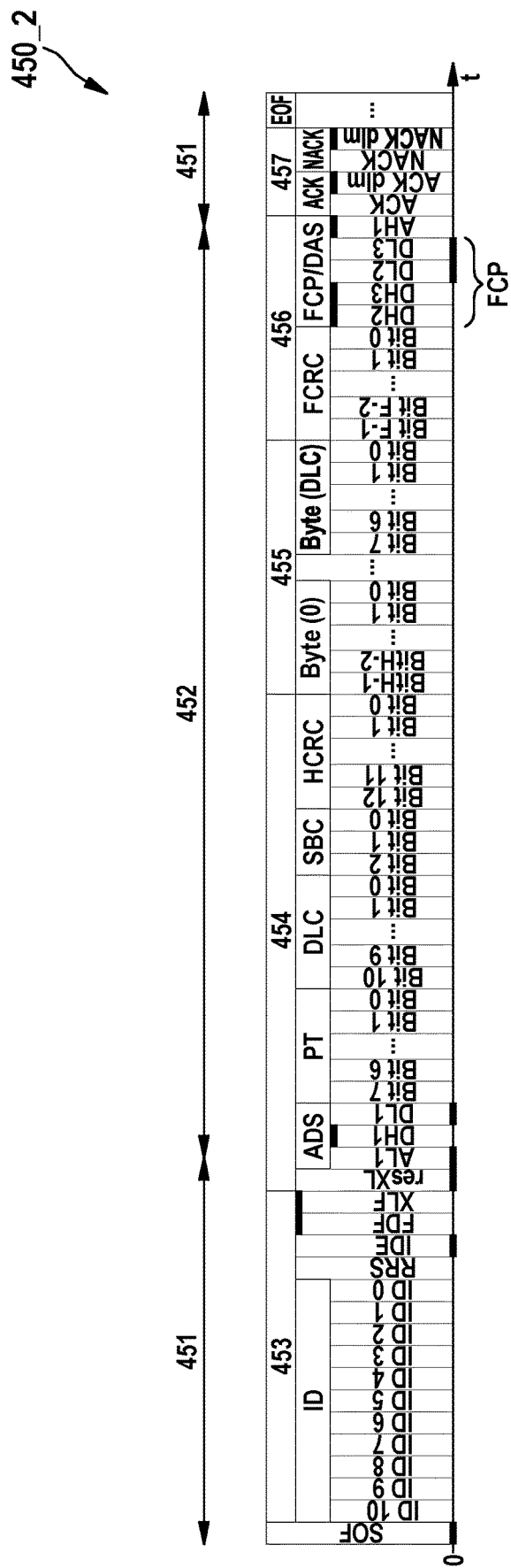
FIG. 7 shows a diagram for illustrating the design of a message that may be transmitted from a user station of the bus system according to a third exemplary embodiment of the present invention.

FIG. 7 shows a frame 450_2 according to a third exemplary embodiment in which CAN XL and CAN FD are compatible. In this exemplary embodiment, error frames (error flags) 47 are used to signal errors.

In the present exemplary embodiment, frame 450_2 and thus the CAN XL frame format are different from frame 450_1 from FIG. 6, as described below. Only the differences from frame 450_1 from FIG. 6 are described below. In other respects, frames 450_1, 450_2 of the two exemplary embodiments are the same.

Neither an RP field nor a SYN field is present in frame 450_2. Therefore, the necessary synchronization takes place after the bit rate switchover, at edge AH1 (1)=>ACK (0). This approach has two advantages.

The first advantage is that the phase error for frame 450_2 from FIG. 7, shortly before the synchronization to edge AH1 (1)=>ACK (0), is less than or equal to the phase error that prevails for frame 450_1 from FIG. 6 shortly before the synchronization to edge SYNdlm (1)=>ACK (0). The reason is that for frame 450_2 from FIG. 7, only 2 short bits (DL2, DL3) and one long bit (AH1) have elapsed since the last synchronization. In contrast, for frame 450_1 from FIG. 6, two long bits (AL2, SYNdlm) have elapsed.

The second advantage is a lower overhead of frame 450_2 from FIG. 7 in comparison to frame 450_1 from FIG. 6. Frame 450_2 from FIG. 7 has two fewer long bits than frame 450_1 from FIG. 6. As a result, the overhead is lower and the net data rate is thus higher.

Since error frames (error flags) 47 are also used in the present exemplary embodiment, the use of a NACK field is strictly optional due to the fact that errors may already be signaled via error frames (error flags) 47.

Figure 8:
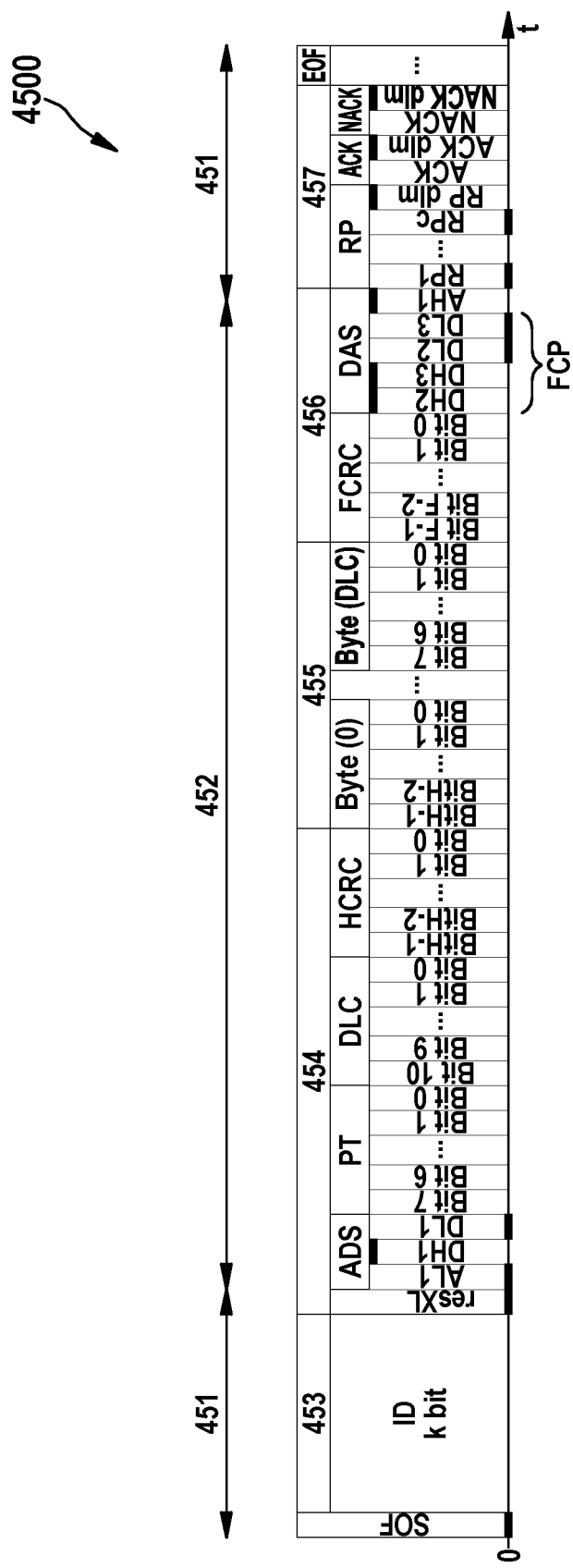
FIG. 8 shows a diagram for illustrating the design of a message that may be transmitted from a user station of the bus system according to a fourth exemplary embodiment of the present invention.

FIG. 8 shows a frame 4500 according to a fourth exemplary embodiment in which the frame formats of CAN XL and CAN FD are not compatible. In this exemplary embodiment, frame 4500 and thus the CAN XL frame format are different from frame 450 from FIG. 2, as described below. Only the differences from frame 450 from FIG. 2 are described. In other respects, frames 450, 4500 of the two exemplary embodiments are the same.

In general, when creating frame 4500 according to the present exemplary embodiment only the fixed stuffing rule is used, so that a fixed stuff bit is to be inserted after a fixed number of bits. Alternatively, instead of only one stuff bit, two or more bits may also be inserted as fixed stuff bits. For a known value of data length code DLC, this results in a constant frame length or a constant length of frame 4500. This prevents various problems that are caused by dynamic stuff bits. Consequently, an SBC field in the header of frame 4500 is also not necessary.

In frame 4500 according to the present exemplary embodiment, identifier ID is no longer limited to 11 bits or 29 bits as with CAN FD. Number k of the bits of identifier ID may be freely selected. However, number k is alternatively settable to a fixed value. For a high net data rate, an ID including k=8 bits is reasonable. This is sufficient to give each user station 10, 20, 30 of bus system 1 an adequate number of bus access priorities. Of course, some other value of k is selectable, depending on the need and the number of various priorities in bus system 1.

Bits RRS, IDE, FDF, XLF of frame 450 from FIG. 2 are no longer necessary in frame 4500 and are omitted. This saves 4 bits, so that the frame overhead is reduced. The net data rate in bus system 1 is thus increased.

End field EOF includes only 5 bits in frame 4500 when the NACK bit is dominant. In contrast, if the NACK bit is recessive, end field EOF includes 3 bits. This ensures that 6 recessive bits are transmitted at the end of frame 4500. This number of recessive bits cannot occur at any other location in a valid frame 4500 when a fixed stuff bit is inserted after 5 identical bits in arbitration phase 451. Alternatively, there could be more than 6 bits. In particular, the number of EOF bits must be adapted to the number of bits after which a fixed stuff bit is inserted.

Interframe space IFS does not require a minimum length in frame 4500. In particular, interframe space IFS may have the length 0. In such a case, two frames 4500 are seamlessly transmitted in succession. However, an interframe space IFS that includes 1 bit, for example, is also reasonable in order to increase the robustness of bus system 1 in comparison to the previously stated case. Due to the now 7 recessive bits between two frames 4500, a new user station at bus 40 may synchronize more reliably.

Figure 9:
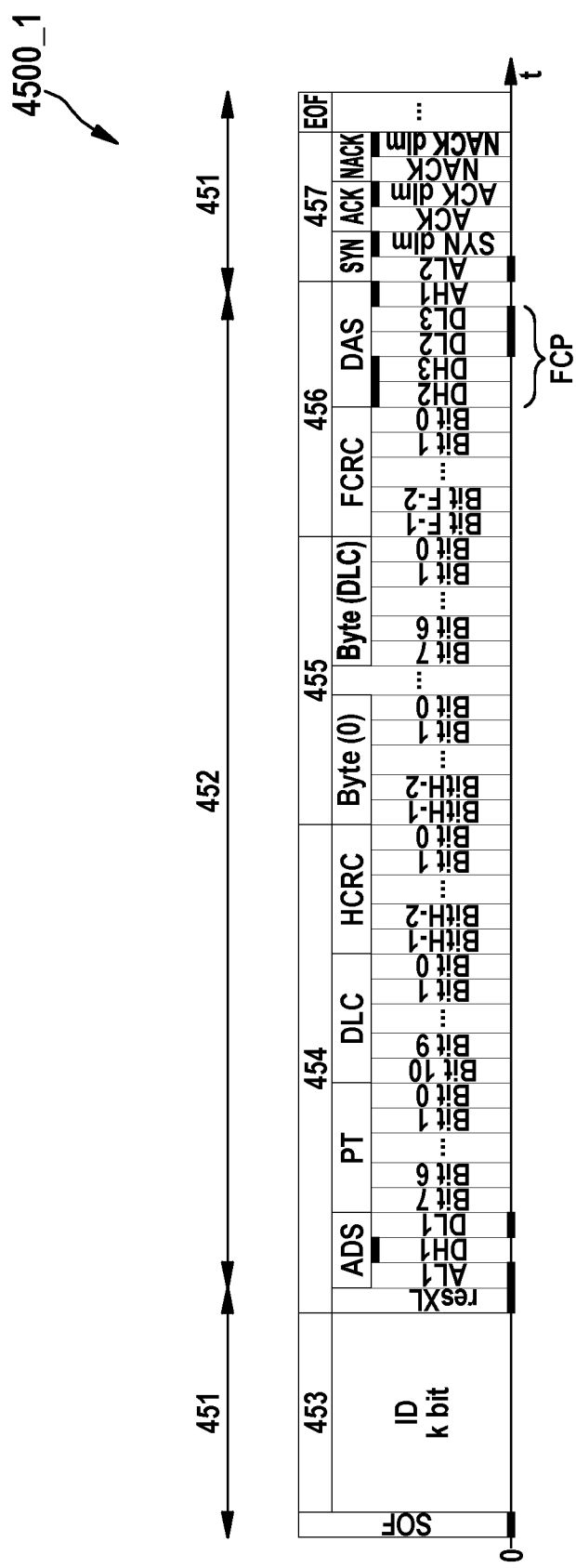
FIG. 9 shows a diagram for illustrating the design of a message that may be transmitted from a user station of the bus system according to a fifth exemplary embodiment of the present invention.

FIG. 9 shows a frame 4500_1 according to a fifth exemplary embodiment in which the frame formats of CAN XL and CAN FD are not compatible. In this exemplary embodiment, frame 4500_1 and thus the CAN XL frame format are different from frame 4500 from FIG. 8, as described with reference to the second exemplary embodiment.

Thus, in frame 4500_1, a SYN field having a constant length of 2 bits is present instead of the RP field. As a result, the synchronization takes place after data phase 452, as described with reference to the second exemplary embodiment.

In other respects, frames 4500, 4500_1 of the two exemplary embodiments are the same.

Figure 10:
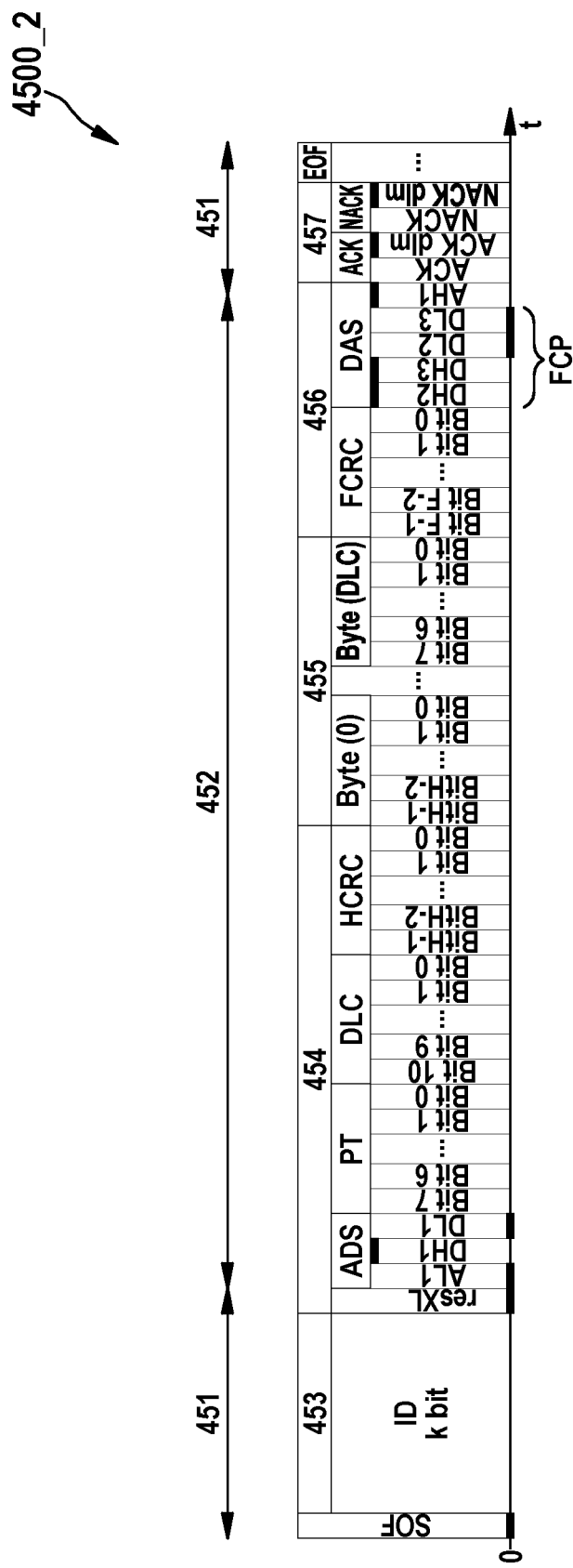
FIG. 10 shows a diagram for illustrating the design of a message that may be transmitted from a user station of the bus system according to a sixth exemplary embodiment of the present invention.

FIG. 10 shows a frame 4500_2 according to a sixth exemplary embodiment in which the frame formats of CAN XL and CAN FD are not compatible. In this exemplary embodiment, frame 4500_2 and thus the CAN XL frame format are different from frame 4500 from FIG. 8, as described with reference to the third exemplary embodiment.

Thus, neither an RP field nor a SYN field is present in frame 4500_2. Therefore, the synchronization takes place after data phase 452, as described with reference to the third exemplary embodiment.

In other respects, frames 4500, 4500_2 of the two exemplary embodiments are the same.

All of the above-described embodiments of user stations 10, 20, 30, of bus system 1, and of the method carried out therein may be used alone or in any possible combination. In particular, all features of the above-described exemplary embodiments and/or modifications thereof may be arbitrarily combined. Additionally or alternatively, in particular the following modifications are possible.

Although the present invention is described above with the example of the CAN bus system, the present invention may be employed for any communications network and/or communication method in which two different communication phases are used in which the bus states, which are generated for the different communication phases, differ. In particular, the present invention is usable for developments of other serial communications networks, such as Ethernet and/or 100Base-T1 Ethernet, field bus systems, etc.

In particular, bus system 1 according to the exemplary embodiments may be a communications network in which data are serially transferable at two different bit rates. It is advantageous, but not a mandatory requirement, that in bus system 1, exclusive, collision-free access of a user station 10, 20, 30 to a shared channel is ensured, at least for certain time periods.

The number and arrangement of user stations 10, 20, 30 in bus system 1 of the exemplary embodiments is arbitrary. In particular, user station 20 in bus system 1 may be dispensed with. It is possible for one or multiple of user stations 10 or 30 to be present in bus system 1. It is possible for all user stations in bus system 1 to have the same design, i.e., for only user station 10 or only user station 30 to be present.

What is claimed is:

1. A user station for a serial bus system, comprising:
   a communication control device configured to control a communication of the user station with at least one other user station of the bus system; and
   a transceiver device configured to serially transmit a transmission signal, generated by the communication control device, onto a bus of the bus system, and to serially receive signals from the bus of the bus system;
   wherein the communication control device is configured to generate the transmission signal according to a frame and to insert into the frame two check sums that include different bits of the frame in a computation of the check sums, the communication control device being configured to insert dynamic stuff bits into the frame so that an inverse stuff bit is inserted into a bit stream of the frame after 5 identical bits in succession, and the communication control device being configured to compute the two check sums so that a maximum of one of the two check sums includes the dynamic stuff bits in the computation.

2. The user station as recited in claim 1, wherein the communication control device is configured to insert a first field into the frame in which a number of the dynamic stuff bits are encoded, and the communication control device is configured to insert the at least one first field prior to a data field in which useful data of the frame are inserted.

3. The user station as recited in claim 1, wherein the transceiver device, for serially transmitting the transmission signal, generated by the communication control device, onto the bus of the bus system, is configured so that for a message that is exchanged between user stations of the bus system, a bit time of a signal that is transmitted onto the bus in a first communication phase may be different from a bit time of a signal that is transmitted in a second communication phase.

4. The user station as recited in claim 1, wherein the communication control device is configured to insert a second field into the frame, which is configured for checking whether the bit stream of the frame in a user station of the bus system, which has received the frame but has not sent it, is shifted by at least one bit compared to the expected frame, and the communication control device is configured to insert the at least one second field into the frame after a data field after a frame check sum that has been formed over all bits in the frame.

5. The user station as recited in claim 4, wherein the communication control device is configured to insert, after the at least one second field, a synchronization field including two bits into the frame so that the two bits have different values, so that the bits form a synchronization edge that is situated according to a bit pattern for switching over a bit rate to transmit the transmission signal onto the bus, and for switching over a physical layer of the transceiver device.

6. The user station as recited in claim 3, wherein the frame that is formed for the message is compatible with CAN FD, and in a first communication phase, it is negotiated which of the user stations of the bus system in a subsequent second communication phase obtains, at least temporarily, exclusive, collision-free access to the bus.

7. A bus system, comprising:
   a bus; and
   at least two user stations that are connected to one another via the bus so that they may communicate serially with one another, wherein at least one of the user station includes:
      a communication control device configured to control a communication of the user station with at least one other user station of the bus system; and
      a transceiver device configured to serially transmit a transmission signal, generated by the communication control device, onto a bus of the bus system, and to serially receive signals from the bus of the bus system;
   wherein the communication control device is configured to generate the transmission signal according to a frame and to insert into the frame two check sums that include different bits of the frame in a computation of the check sums, the communication control device being configured to insert dynamic stuff bits into the frame so that an inverse stuff bit is inserted into a bit stream of the frame after 5 identical bits in succession, and the communication control device being configured to compute the two check sums so that a maximum of one of the two check sums includes the dynamic stuff bits in the computation.

8. A method for communicating in a serial bus system, the method being carried out using a user station of the bus system that includes a communication control device and a transceiver device, the method comprising:
   controlling, via the communication control device, a communication of the user station with at least one other user station of the bus system;
   transmitting, via the transceiver device, a transmission signal, generated by the communication control device, onto a bus of the bus system, the transceiver device also being configured to serially receive signals from the bus of the bus system; and
   generating, via the communication control device, the transmission signal according to a frame, the communication control device inserting into the frame two check sums that include different bits of the frame in a computation of the check sums, the communication control device inserting dynamic stuff bits into the frame so that an inverse stuff bit is inserted into a bit stream of the frame after 5 identical bits in succession, and the communication control device computing the two check sums so that a maximum of one of the two check sums includes the dynamic stuff bits in the computation.

* * * * *